(12) United States Patent
Fukai

(10) Patent No.: US 7,826,261 B2
(45) Date of Patent: Nov. 2, 2010

(54) SEMICONDUCTOR MEMORY DEVICE, METHOD OF WRITING DATA THEREIN, AND METHOD OF READING DATA THEREFROM

(75) Inventor: Toshinori Fukai, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 210 days.

(21) Appl. No.: 12/155,648

(22) Filed: Jun. 6, 2008

(65) Prior Publication Data

US 2008/0304315 A1 Dec. 11, 2008

(30) Foreign Application Priority Data

Jun. 7, 2007 (JP) ............... 2007-152014

(51) Int. Cl.
*G11C 11/34* (2006.01)
(52) U.S. Cl. .................. 365/182; 365/63; 365/72
(58) Field of Classification Search ................. 257/205, 257/371
See application file for complete search history.

(56) References Cited

U.S. PATENT DOCUMENTS 5,243,559 A * 9/1993 Murai .................... 365/185.27
5,657,271 A * 8/1997 Mori ...................... 365/185.27
5,875,129 A * 2/1999 Atsumi et al. .......... 365/185.27
6,498,527 B2 * 12/2002 Matsumoto ................. 327/536

FOREIGN PATENT DOCUMENTS

| JP | 2005-39220 | 2/2005 |
| JP | 2006-85753 | 3/2006 |
| JP | 2006-338773 | 12/2006 |

* cited by examiner

Primary Examiner—Tan T. Nguyen
(74) Attorney, Agent, or Firm—McGinn IP Law Group, PLLC

(57) ABSTRACT

A semiconductor memory device (1) has a FET (10) (first field-effect transistor), a FET (20) (second field-effect transistor), a contact plug (32) (first conductive plug), contact plugs (34) (second conductive plugs), and a detection circuit (50). The FET (20) is provided in a double well (40). M (m is a natural number) contact plugs (32) are connected to a diffusion layer (22) of the FET (20) while n (n is a natural number) contact plugs (34) are connected to a diffusion layer (24). Here, m is smaller than n. The detection circuit (50) detects the difference between the output of the FET (10) and the output of the FET (20).

15 Claims, 20 Drawing Sheets

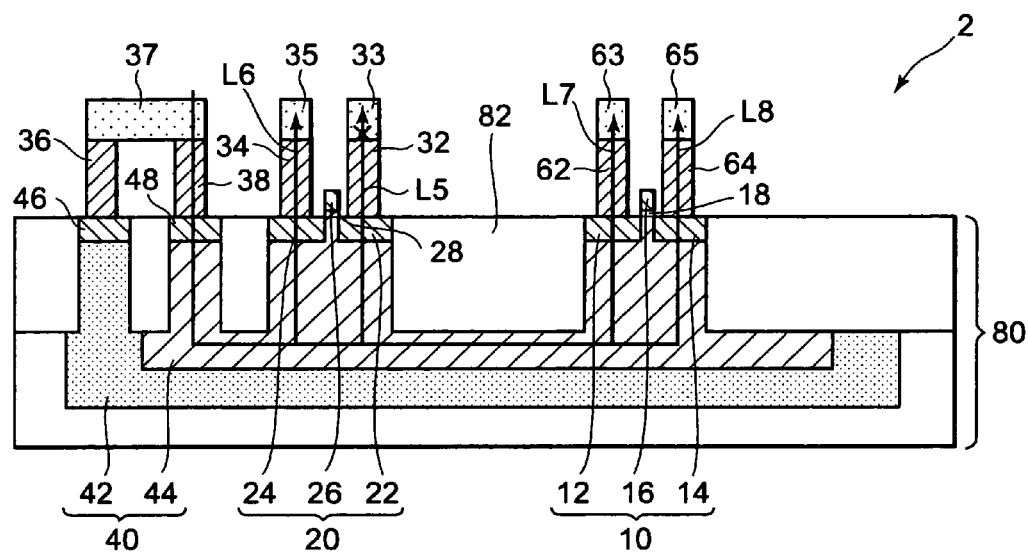
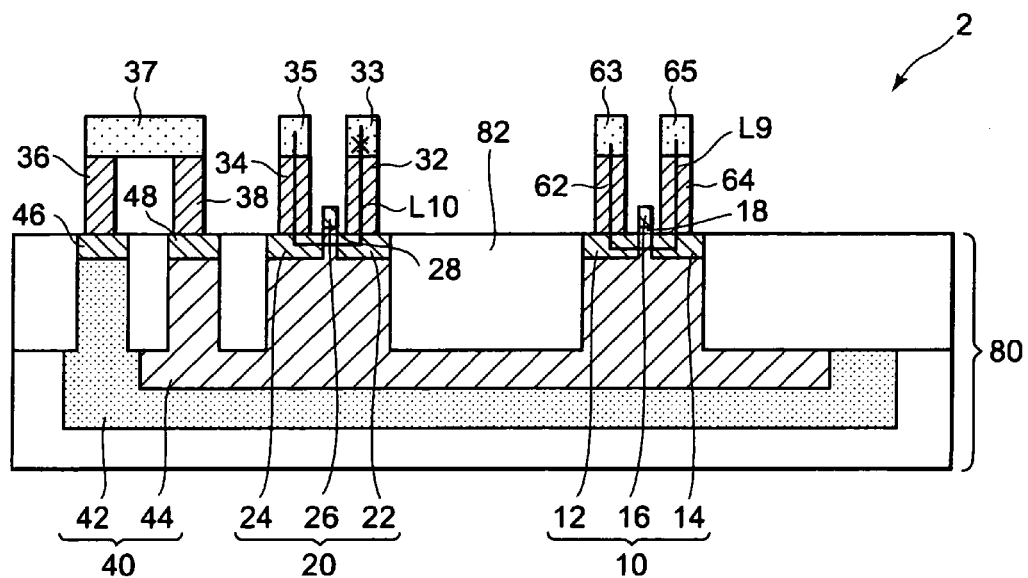

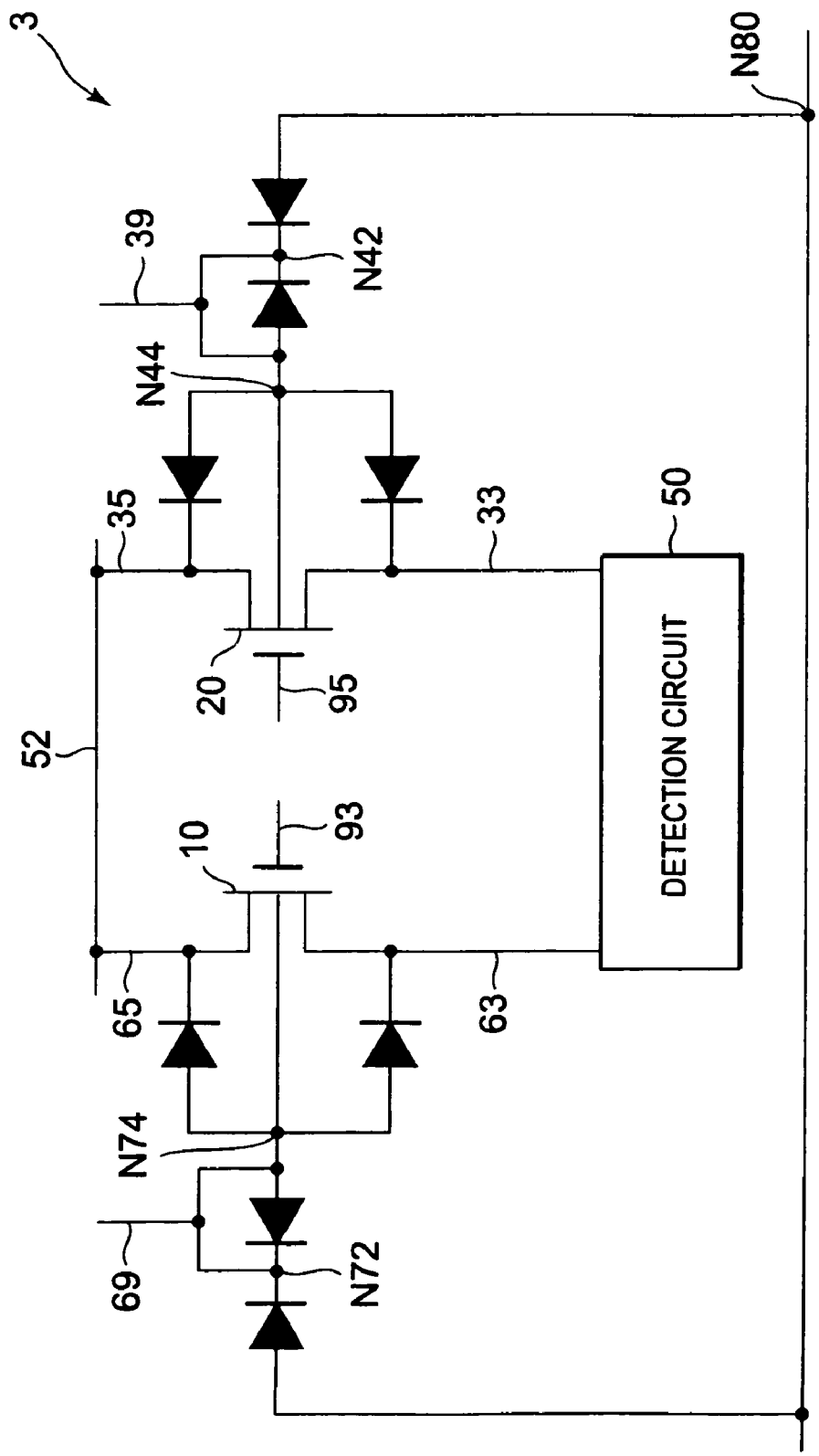

SEMICONDUCTOR MEMORY DEVICE, METHOD OF WRITING DATA THEREIN, AND METHOD OF READING DATA THEREFROM

BACKGROUND OF THE INVENTION

1. Field of the Invention

The present invention relates to a semiconductor memory device, a method of writing data therein, and a method of reading data therefrom.

2. Description of the Related Art

JP 2006-85753 A and JP 2006-338773 A each describe a conventional semiconductor memory device, for example. The semiconductor memory devices described in those documents each have a plurality of memory chips. Each memory chip has storing means where information for identifying the memory chip (chip ID) is stored. The storing means includes a plurality of fuses. The chip ID is adapted to be written by disconnecting/connecting the fuses. Specifically, whether the respective fuses have data of 0 or 1 is determined by whether the respective fuses are completely disconnected or not.

It is to be noted that, in addition to JP 2006-85753 A and JP2006-338773A, JP2005-39220A is also given as the related art of the present invention.

The present inventor has recognized as follows. Even if the fuses are disconnected, under the influence of electromigration or the like, the disconnected portions may be connected again. In that case, the data of the fuses (0 or 1) are inverted. Therefore, the semiconductor memory device described above is susceptible to improvement with regard to reliability.

SUMMARY

According to one aspect of the present invention, there is provided a semiconductor memory device including: a first field-effect transistor provided in a double well; m (m is a natural number) first conductive plugs electrically connected to one of a source region and a drain region of the second field-effect transistor; and n (n is a natural number) second conductive plugs electrically connected to another one of the source region and the drain region of the second field-effect transistor, in which m is smaller than n. The semiconductor memory device may further include a second first field-effect transistor; and a detection circuit for detecting difference between output of the first field-effect transistor and output of the second field-effect transistor, Further, according to another aspect of the present invention, there is provided a method of writing data in the semiconductor memory device, including a step of passing current so that resistance of at least one of the first conductive plugs is increased, through the at least one of the first conductive plugs.

Still further, according to still another aspect of the present invention, there is provided a method of reading data from the semiconductor memory device, including a step of detecting difference between output of the first field-effect transistor and output of the second field-effect transistor.

In the semiconductor memory device, the number of the conductive plugs electrically connected to the source region of the second field-effect transistor and the number of the conductive plugs electrically connected to the drain region are different. Therefore, by passing current through the conductive plugs the number of which is smaller, the resistance of the conductive plugs can be easily increased. This change in resistance appears as change in output (potential or current) of the second field-effect transistor. Therefore, by detecting by the detection circuit the difference between the output of the first field-effect transistor and the output of the second field-effect transistor, whether the resistance of the conductive plugs is increased or not can be determined. Specifically, the presence or absence of the increase in the resistance of the conductive plugs determine whether the data is 0 or 1.

With such a structure, data can be written even if the conductive plugs are not completely disconnected. Therefore, the above-mentioned problem, that is, the problem that the data are inverted due to reconnection of the disconnected portions can be avoided.

According to the present invention, a semiconductor memory device with excellent reliability, a method of writing data therein, and a method of reading data therefrom are materialized.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 8A and 8B are sectional views for explaining operation of the semiconductor memory device according to the second embodiment;

FIG. 11 is a circuit diagram of the semiconductor memory device according to the third embodiment;

DETAILED DESCRIPTION OF THE PREFERRED EMBODIMENTS

Figure 1:
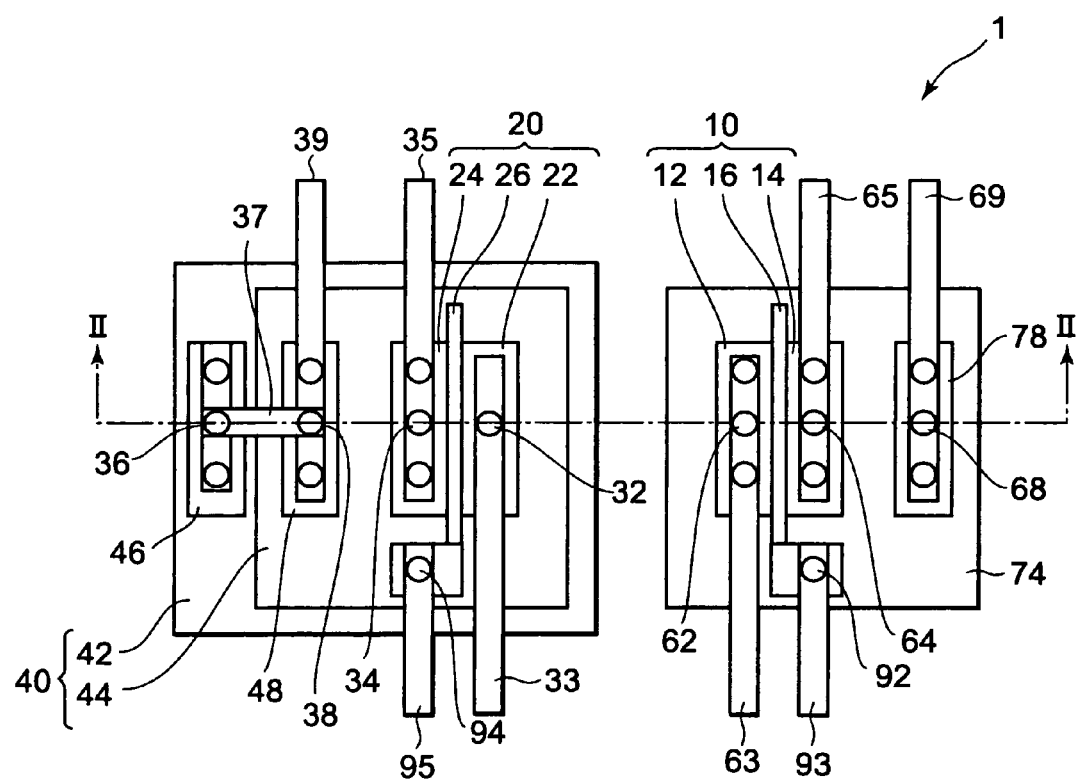
FIG. 1 is a plan view illustrating a first embodiment of a semiconductor memory device according to the present invention.

Preferred embodiments of the present invention are described in detail in the following with reference to the attached drawings. It is to be noted that, for the description of the drawings, like reference numerals are used to designate like members and description thereof is omitted to avoid redundancy.

First Embodiment

Figure 2:
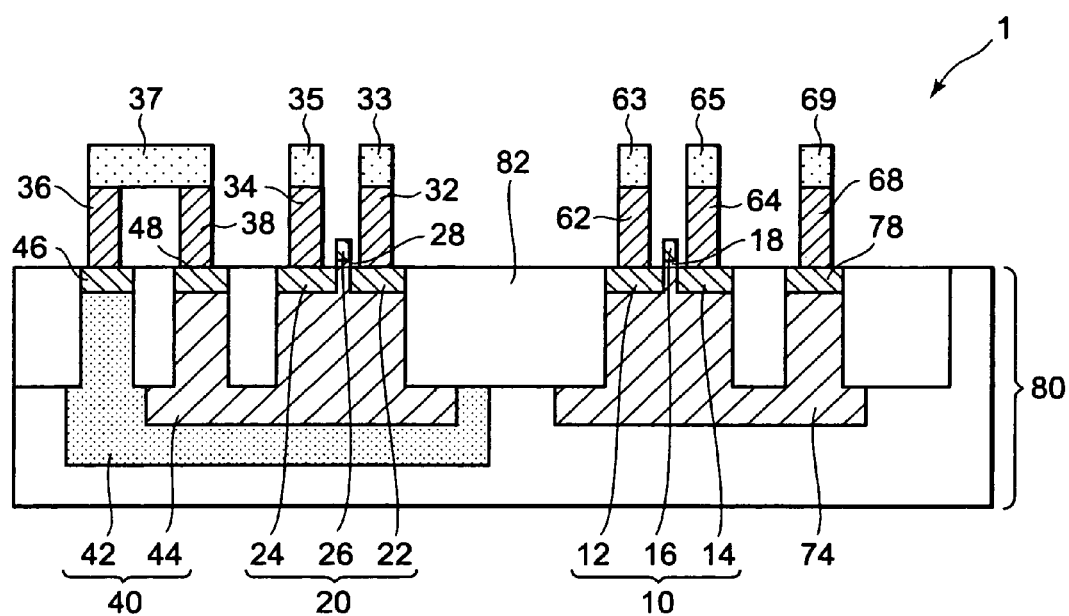
FIG. 2 is a sectional view illustrating the first embodiment of a semiconductor memory device according to the present invention.
Figure 3:
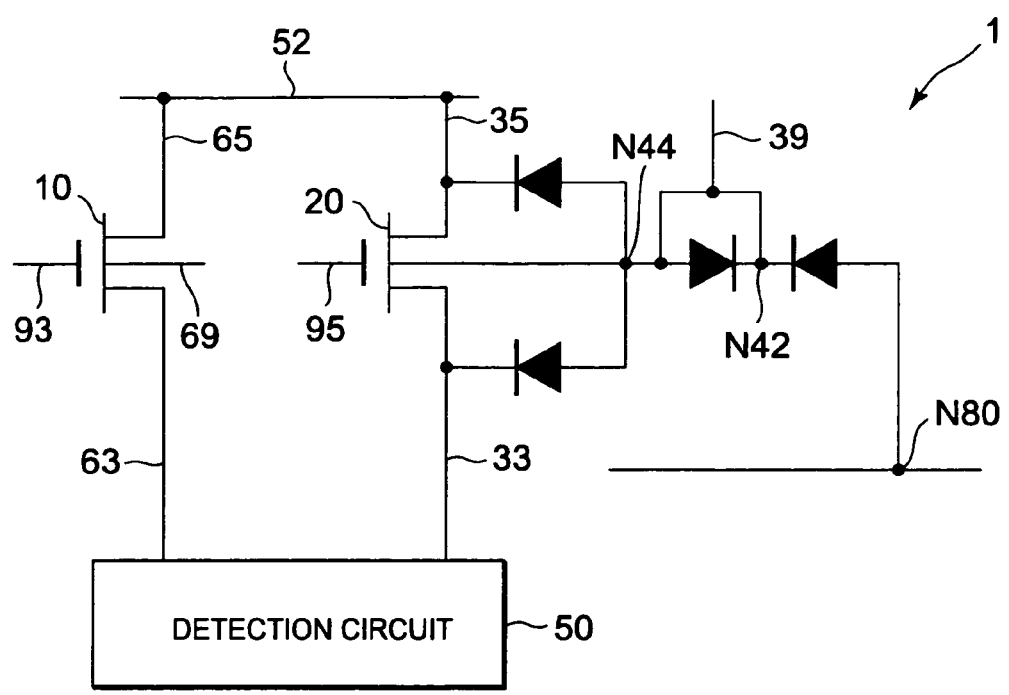
FIG. 3 is a circuit diagram of the semiconductor memory device according to the first embodiment.

FIGS. 1 and 2 are a plan view and a sectional view, respectively, illustrating a first embodiment of a semiconductor memory device according to the present invention. FIG. 2 is a section taken along the line II-II of FIG. 1. FIG. 3 is a circuit diagram of the semiconductor memory device.

A semiconductor memory device 1 has a FET 10 (first field-effect transistor), a FET 20 (second field-effect transistor), a contact plug 32 (first conductive plug), contact plugs 34 (second conductive plugs), and a detection circuit 50. It is to be noted that, in FIGS. 1 and 2, the detection circuit 50 is omitted.

The FET 10 has an n+ diffusion layer 12 (source region), an n+ diffusion layer 14 (drain region), and a gate electrode 16. The gate electrode 16 is provided on a semiconductor substrate 80 with a gate insulating film 18 therebetween. In this embodiment, the semiconductor substrate 80 is a p-type silicon substrate. The FET 10 is formed in a p-type well region 74.

Contact plugs 62 and contact plugs 64 are connected to the diffusion layer 12 and the diffusion layer 14, respectively. In this embodiment, three contact plugs 62 and three contact plugs 64 are provided. Contact plugs 68 are electrically connected to the well region 74 through a p+ diffusion layer 78. Wiring 63, wiring 65, and wiring 69 are connected to the contact plugs 62, the contact plugs 64, and the contact plugs 68, respectively. Further, as illustrated in FIG. 1, wiring 93 is connected to the gate electrode 16 through a contact plug 92.

The FET 20 has an n+ diffusion layer 22 (a source region), an n+ diffusion layer 24 (drain region), and a gate electrode 26. The gate electrode 26 is provided on the semiconductor substrate 80 with a gate insulating film 28 therebetween. W (gate width) and L (gate length) of the FET 20 are preferably equal to W and L of the FET 10, respectively. Further, the thickness, threshold voltage, and power supply voltage of the gate insulating film 28 of the FET 20 are preferably equal to the thickness, threshold voltage, and power supply voltage of the gate insulating film 18 of the FET 10, respectively. Ls of the FETs 10 and 20 are preferably larger than the minimum L of FETs provided in the semiconductor memory device 1.

The FET 20 is provided in a double well 40. The double well 40 is formed by an n-type well region 42 (a deep n-well) and a p-type well region 44. The FET 10 and the FET 20 are separated from each other by an element separation region 82. The element separation region 82 is formed by, for example, shallow trench isolation (STI).

M (m is a natural number) contact plugs 32 are connected to the diffusion layer 22 while n (n is a natural number) contact plugs 34 are connected to the diffusion layer 24. Here, m is smaller than n. In this embodiment, m=1 and n=3. The contact plug 32 and the contact plugs 34 are provided in the same layer in wiring layers (not shown). The wiring layers are provided on the semiconductor substrate 80 and formed of interlayer insulating films including a conductive pattern such as wiring.

Contact plugs 36 are electrically connected to the well region 42 through an n+ diffusion layer 46. Similarly, contact plugs 38 are electrically connected to the well region 44 through a p+ diffusion layer 48. Wiring 33 and wiring 35 are connected to the contact plug 32 and the contact plugs 34, respectively. The contact plugs 36 and the contact plugs 38 are electrically connected to each other by wiring 37. As illustrated in FIG. 1, wiring 39 is connected to the contact plugs 38. Further, wiring 95 is connected to the gate electrode 26 through a contact plug 94. In addition, each of the above mentioned contact plugs 32, 34, 36, 38, 62, 64, 68, 92, 94 comprises metal, for example tungsten or copper.

As illustrated in FIG. 3, the detection circuit 50 is connected to the FET 10 and the FET 20. Specifically, the detection circuit 50 is connected to each of the sources of the FETs 10 and 20. The detection circuit 50 detects the difference between the output of the FET 10 and the output of the FET 20 with predetermined potential being applied to a power supply line 52. For example, the detection circuit 50 detects the difference between the source potential of the FET 10 and the source potential of the FET 20. Alternatively, the detection circuit 50 detects the difference between the source current of the FET 10 and the source current of the FET 20. The detection circuit 50 is adapted to output 0 (or 1) when the difference is equal to or smaller than a predetermined threshold value and is adapted to output 1 (or 0) when the difference is larger than the threshold value.

It is to be noted that the potentials of a node N42, a node N44, and a node N80 in FIG. 3 correspond to the potentials of the well region 42, the well region 44, and the semiconductor substrate 80 of FIGS. 1 and 2, respectively. The potential of anode N80, that is, the potential of the semiconductor substrate 80 is, for example, the ground potential.

Figure 20:
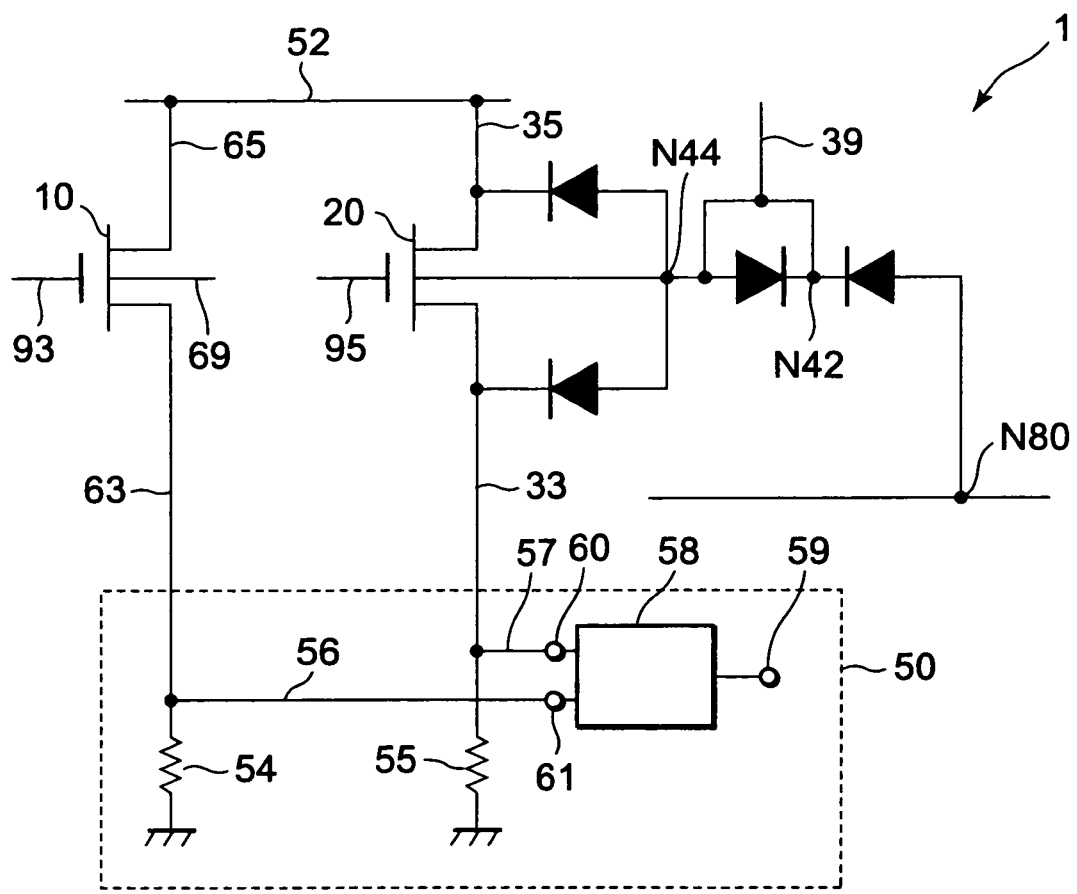
FIG. 20 is a circuit diagram illustrating details of a detection circuit (50) of the circuit diagram of the semiconductor memory device according to the first embodiment.

FIG. 20 illustrates a specific example of the detection circuit 50. The structure illustrated in FIG. 20 is the same as that illustrated in FIG. 3 except that the details of the detection circuit 50 are illustrated. The detection circuit 50 includes a resistance 54 connected to wiring 63, a resistance 55 connected to wiring 33, and a sense amplifier circuit 58. One end of the resistance 54 is connected to the wiring 63 and is, through wiring 56, connected to a second input terminal 61 of the sense amplifier circuit 58. The other end of the resistance 54 is connected to the ground potential. One end of the resistance 55 is connected to the wiring 33, and is, through wiring 57, connected to a first input terminal 60 of the sense amplifier circuit 58. The other end of the resistance 55 is connected to the ground potential. The resistance value of the resistance 54 and the resistance value of the resistance 55 are set to be the same. The sense amplifier circuit 58 outputs to an output terminal 59 an output which corresponds to the difference between the potential which is input to the first input terminal 60 and the potential which is input to the second input terminal 61. The above-mentioned detection circuit 50 is adapted to detect with the sense amplifier circuit 58 a potential difference V1 across the resistance 54 and a potential difference V2 across the resistance 55 when current passing through the FET 10 which is a standard and current passing through the FET 20 are different.

Figure 4A:
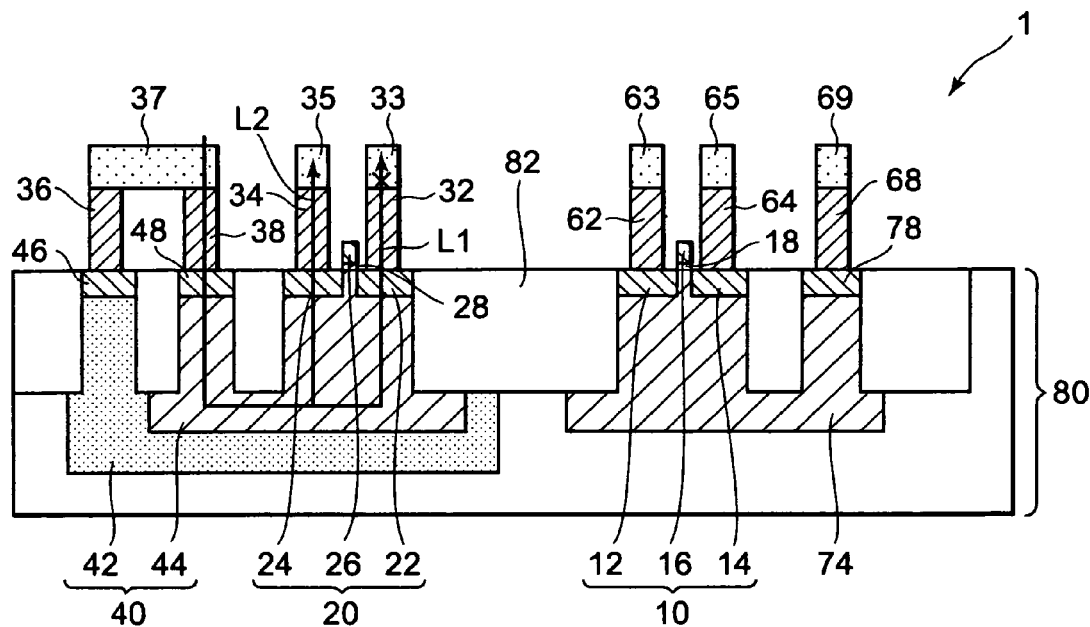
FIGS. 4A and 4B are sectional views for explaining operation of the semiconductor memory device according to the first embodiment.
Figure 4B:
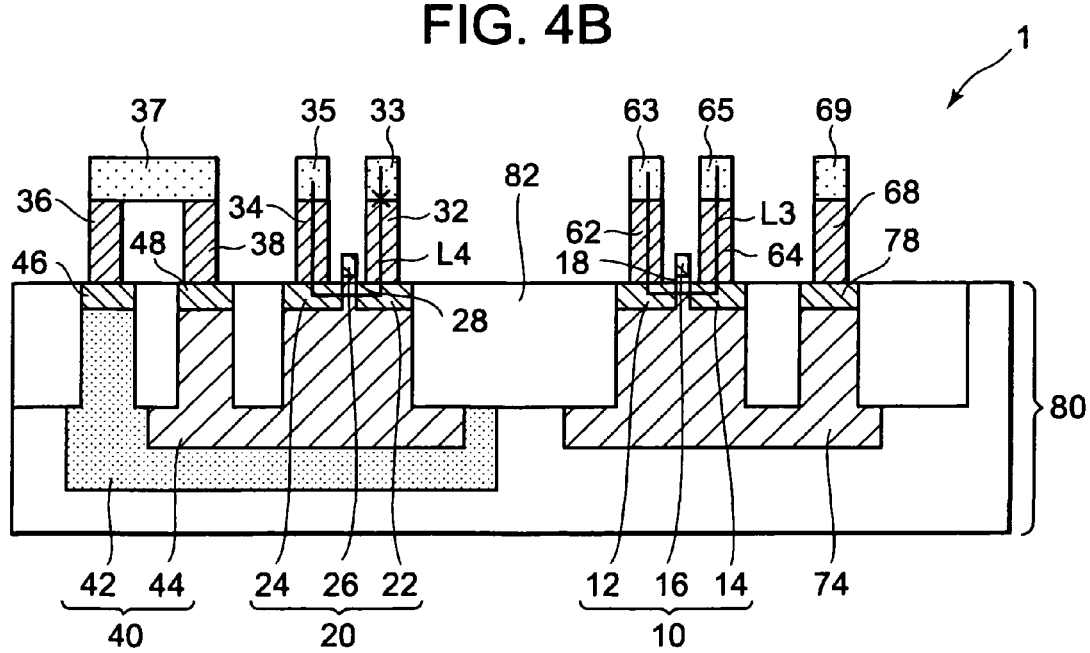

Exemplary operation of the semiconductor memory device 1 is now described with reference to FIGS. 4A and 4B as a first embodiment of a method of writing data and a method of reading data according to the present invention. Those figures illustrate a section identical to that illustrated in FIG. 2. When data is written, as illustrated by a line L1 of FIG. 4A, current is passed through the contact plug 32 so that the resistance of the contact plug 32 is increased. Specifically, current is passed through the contact plug 32 by applying forward bias voltage between the diffusion layer 22 of the FET 20 and the well region 44. Here, the contact plug 32 may be completely disconnected, but the disconnection is not necessary. It is to be noted that, when a plurality of contact plugs 32 are provided, only increase in resistance of at least one of the contact plugs 32 is required.

When data is read, the detection circuit 50 detects the difference between the output of the FET 10 and the output of the FET 20. For example, as illustrated by lines L3 and L4 of FIG. 4B, current is passed between the sources and the drains of the FETs 10 and 20, respectively, and the difference between the output potential of the FET 10 and the output potential of the FET 20 is detected. In this way, in the semiconductor memory device 1, the FET 10 is a reference cell while the FET 20 is a memory cell.

Effects of this embodiment is described. In the semiconductor memory device 1, the number of the contact plug 32 electrically connected to the source region (diffusion layer 22) of the FET 20 and the number of the contact plugs 34 electrically connected to the drain region (diffusion layer 24) are different. Therefore, by passing current through the contact plug 32 the number of which is smaller, the resistance of the contact plug 32 can be easily increased. This change in the resistance appears as change in the output (potential or current) of the FET 20. Therefore, by detecting with the detection circuit 50 the difference between the output of the FET 10 and the output of the FET 20, whether the resistance of the contact plug 32 is increased or not can be determined. In other words, the presence or absence of the increase in the resistance of the conductive plug 32 determines whether the data is 0 or 1.

With such a structure, data can be written even if the contact plug 32 is not completely disconnected. Therefore, the above-mentioned problem with the semiconductor memory devices described in JP 2006-85753 A and JP 2006-338773 A, that is, the problem that the data are inverted due to reconnection of the disconnected portions can be avoided. Therefore, according to the present invention, the semiconductor memory device 1 with excellent reliability, a method of writing data therein, and a method of reading data therefrom are materialized.

Further, the number of the contact plug 32 which is a conductive plug whose resistance is intended to be increased is smaller than the number of the contact plugs 34. This structure makes it possible to increase the resistance of the contact plug 32 with more reliability compared with the case where the numbers of the two kinds of contact plugs are the same. This is described in detail in the following. As illustrated by a line L2 of FIG. 4A, when current is passed through the contact plug 32, the current may also pass through the contact plugs 34. Even in such a case, if the number of the contact plug 32 is smaller than the number of the contact plugs 34, the amount of current per contact plug is larger in the case of the contact plug 32 than in the case of the contact plugs 34. Therefore, the resistance of the contact plug 32 can be selectively increased.

The FET 20 is provided in the double well 40. This structure makes it possible to apply forward bias voltage between the diffusion layer 22 of the FET 20 and the well region 44. By using such forward bias voltage, data can be written (the resistance of the contact plug 32 can be increased) with relatively low voltage. In other words, writing voltage can be made lower.

Only the FET 20 out of the FETs 10 and 20 is provided in the double well. By providing the double well only on the side of the FET 20 in which data is written, the circuit area of the semiconductor memory device 1 can be made small. Further, current which passes through the contact plug 32 can be prevented from flowing into the FET 10. Therefore, design flexibility with regard to the numbers of the contact plugs 62 and the contact plugs 64 is enhanced.

By making smaller the number of the conductive plugs electrically connected to the source region of the FET 20 (contact plug 32) than the number of the conductive plugs electrically connected to the drain region (contact plugs 34), the resistance of the former conductive plugs is adapted to be increased. This is more preferable than a case where the number of the conductive plugs electrically connected to the drain region is smaller than the number of the conductive plugs electrically connected to the source region, because change in resistance of the conductive plugs electrically connected to the source region is more easily detected than change in resistance of the conductive plugs electrically connected to the drain region.

When W and L of the FET 20 are equal to W and L of the FET 10, respectively, the difference between the output of the FET 10 and the output of the FET 20 in the case where the resistance of the contact plug 32 is not increased can be made smaller. When, in addition, the thickness, threshold voltage, and power supply voltage of the gate insulating film of the FET 20 are equal to the thickness, threshold voltage, and power supply voltage of the gate insulating film of the FET 10, respectively, the difference in output can be made further smaller. The smaller the difference between the output of the FET 10 and the output of the FET 20 in the case where the resistance of the contact plug 32 is not increased is, the difference in the output between the FET 10 and the FET 20 is clearly distinguished between the case where the resistance of the contact plug 32 is increased and the case where the resistance of the contact plug 32 is not increased. This decreases the possibility that erroneous data is read from the semiconductor memory device 1, and thus, the reliability of the semiconductor memory device 1 is further enhanced.

When Ls of the FETs 10 and 20 are larger than the minimum L of FETs provided in the semiconductor memory device 1, compared with the case where Ls of the FETs 10 and 20 are equal to the minimum L, the difference between the output of the FET 10 and the output of the FET 20 in the case where the resistance of the contact plug 32 is not increased can be made smaller. This is because, if the FETs 10 and 20 are designed to have the minimum dimensions, a wider range of variation in characteristics is exhibited between the two.

Further, layout of the semiconductor memory device 1 can be done according to logic design rules. Therefore, even after the process is released (even after the manufacturing process is fixed), the semiconductor memory device 1 can be materialized only by changing the layout, which is highly convenient.

Second Embodiment

Figure 5:
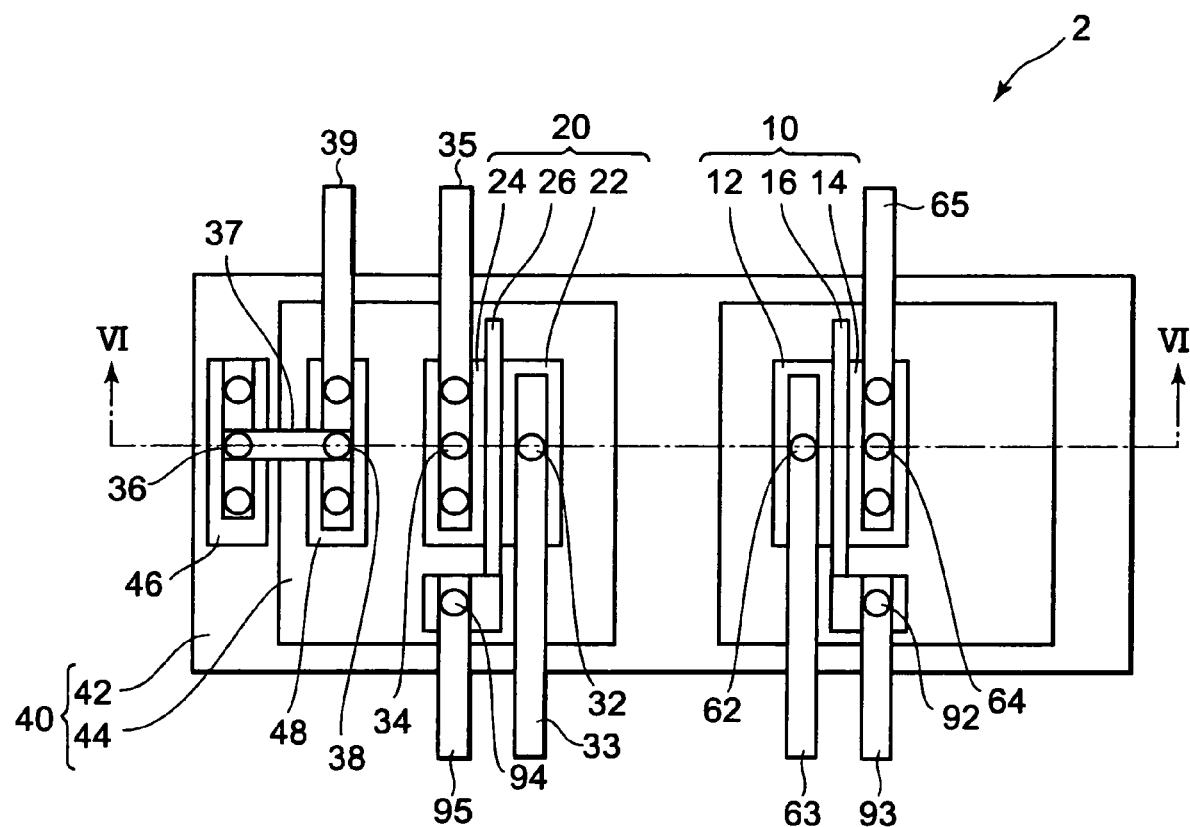
FIG. 5 is a plan view illustrating a second embodiment of a semiconductor memory device according to the present invention.
Figure 6:
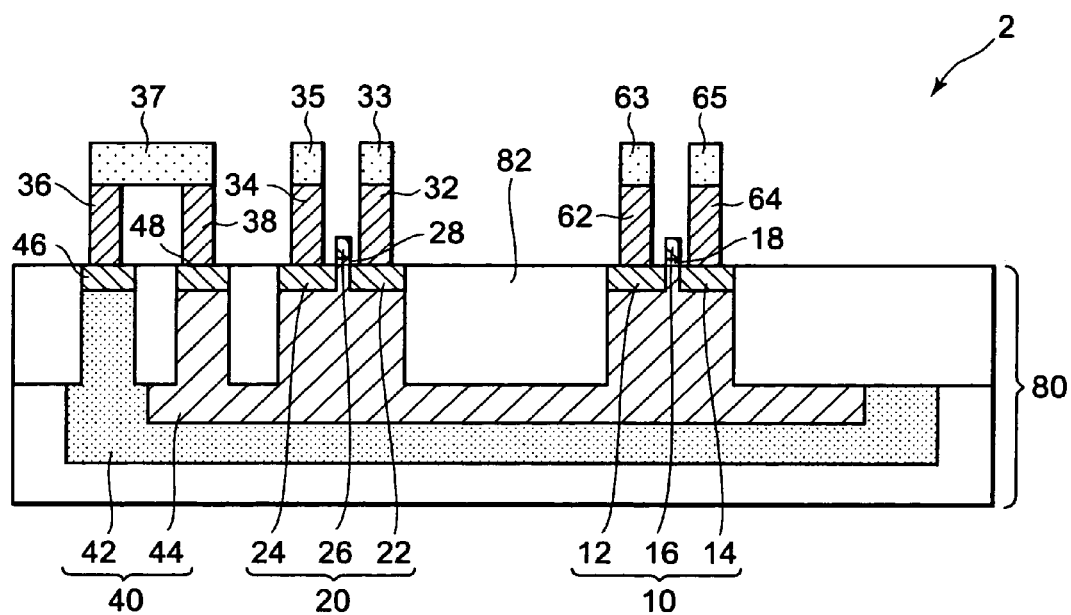
FIG. 6 is a sectional view illustrating the second embodiment of a semiconductor memory device according to the present invention.
Figure 7:
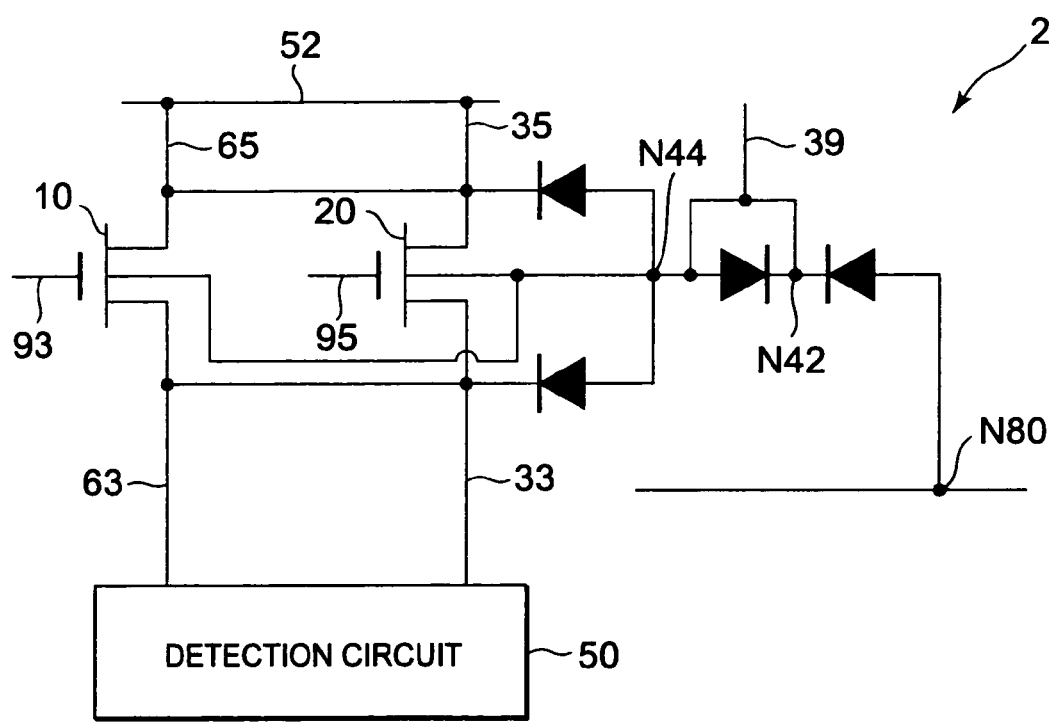
FIG. 7 is a circuit diagram of the semiconductor memory device according to the second embodiment.

FIGS. 5 and 6 are a plan view and a section, respectively, illustrating a second embodiment of a semiconductor memory device according to the present invention. FIG. 6 is a section taken along the line VI-VI of FIG. 5. FIG. 7 is a circuit diagram of the semiconductor memory device. In a semiconductor memory device 2, both of the FET 10 and the FET 20 are provided in the same double well 40. Accordingly, the contact plugs 68, the wiring 69, and the diffusion layer 78 (see FIGS. 1 and 2) are not provided. Except for this, the structure of the semiconductor memory device 2 is the same as that of the semiconductor memory device 1. Further, the structure of a detection circuit 50 illustrated in FIG. 7 may be the same as that of the detection circuit 50 illustrated in FIG. 20.

Exemplary operation of the semiconductor memory device 2 is now described with reference to FIGS. 8A and 8B as a second embodiment of a method of writing data and a method of reading data according to the present invention. Those figures illustrate a section identical to that illustrated in FIG. 6. When data is written, as illustrated by a line L5 of FIG. 8A, current is passed through the contact plug 32 so that the resistance of the contact plug 32 is increased. When data is read, the detection circuit 50 detects the difference between the output of the FET 10 and the output of the FET 20 with predetermined potential being applied to the power supply line 52. For example, as illustrated by lines L9 and L10 of FIG. 8B, current is passed between the sources and the drains of the FETs 10 and 20, respectively, and accordingly the difference between the output potential of the FET 10 and the output potential of the FET 20 is detected.

In this embodiment, the FET 10 and the FET 20 are provided in the same double well 40. Therefore, compared with the case of the first embodiment where only the FET 20 is provided in the double well 40, the circuit area of the semiconductor memory device 2 can be made smaller.

Further, the number of the contact plug 32 which is the conductive plug whose resistance is intended to be increased is smaller than the numbers of the contact plugs 34, 62, and 64. In other words, the number of the contact plug 32 is the smallest among the numbers of the contact plugs 32, 34, 62, and 64. By making smaller the number of the contact plug 32 than the number of the contact plugs 34, it becomes possible to increase the resistance of the contact plug 32 with more reliability compared with the case where the numbers of those kinds of contact plugs are the same. This is described in detail in the following. As illustrated by a line L6 of FIG. 8A, when current is passed through the contact plug 32, the current may also pass through the contact plugs 34. Even in such a case, if the number of the contact plug 32 is smaller than the number of the contact plugs 34, the amount of current per contact plug is larger in the case of the contact plug 32 than in the case of the contact plugs 34. Therefore, the resistance of the contact plug 32 can be selectively increased.

Further, by making larger the numbers of the contact plugs 62 and 64 than the number of the contact plug 32, the resistances of the contact plugs 62 and 64 can be prevented from increasing. This is described in detail in the following. As illustrated by lines L7 and L8 of FIG. 8A, when current is passed through the contact plug 32, the current may also pass through the contact plugs 62 and 64. Even in such a case, if the number of the contact plug 32 is smaller than the numbers of the contact plugs 62 and 64, the amount of current per contact plug is larger in the case of the contact plug 32 than in the case of the contact plugs 62 and 64. Therefore, the resistance of the contact plug 32 can be selectively increased and the resistances of the contact plugs 62 and 64 can be prevented from increasing. Except for this, effects of this embodiment are the same as those of the first embodiment of the present invention.

Third Embodiment

Figure 9:
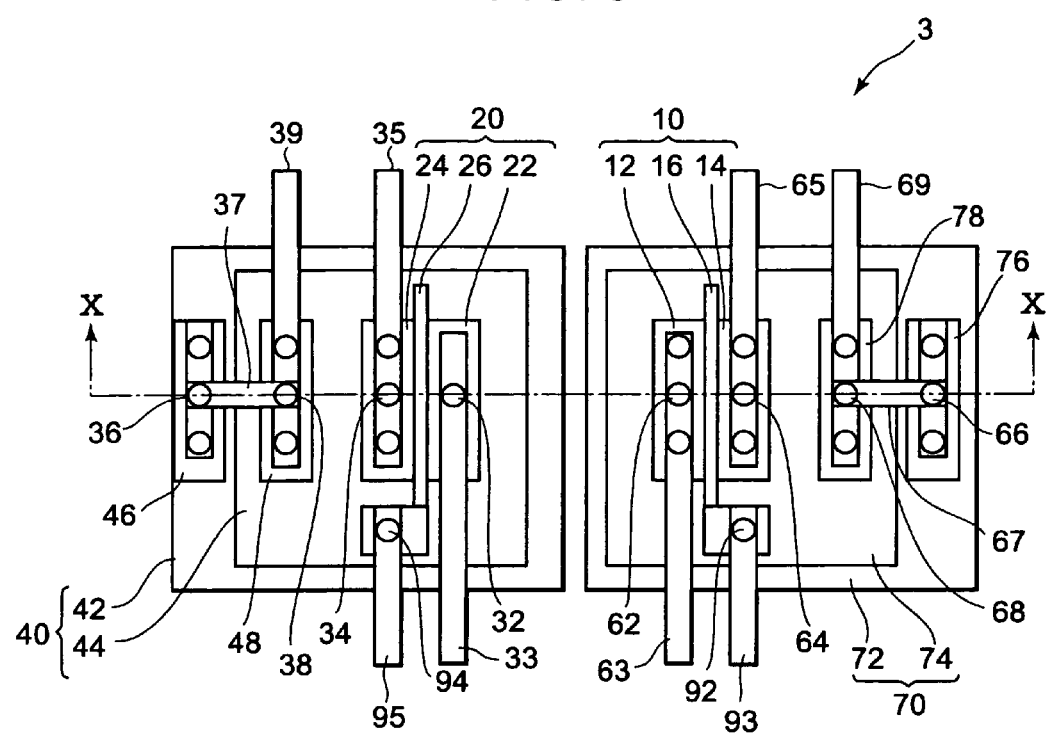
FIG. 9 is a plan view illustrating a third embodiment of a semiconductor memory device according to the present invention.
Figure 10:
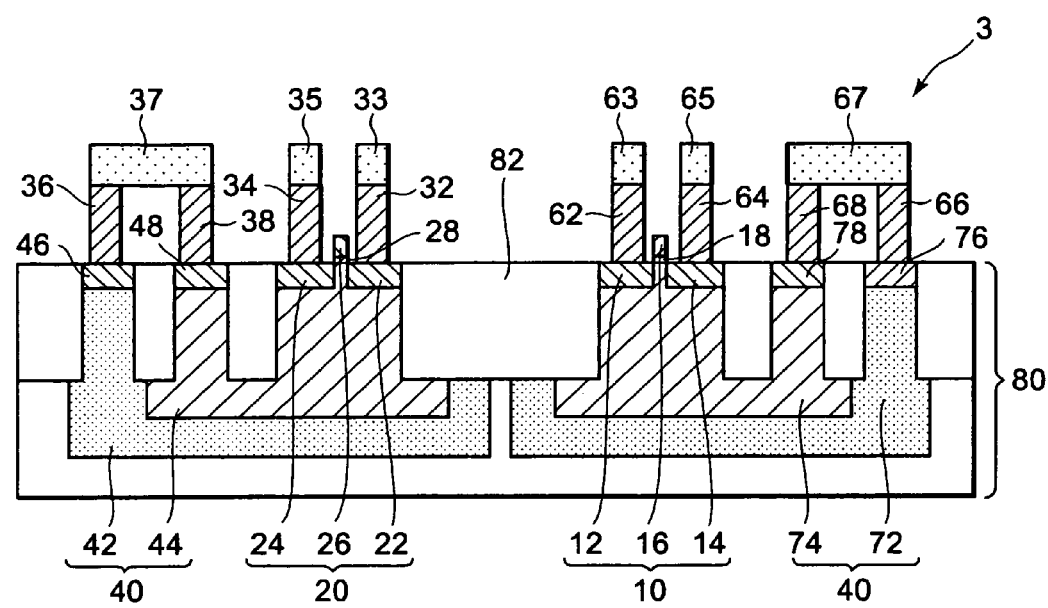
FIG. 10 is a sectional view illustrating the third embodiment of a semiconductor memory device according to the present invention.

FIGS. 9 and 10 are a plan view and a sectional view, respectively, illustrating a third embodiment of a semiconductor memory device according to the present invention. FIG. 10 is a sectional view taken along the line X-X of FIG. 9. FIG. 11 is a circuit diagram of the semiconductor memory device. In a semiconductor memory device 3, the FET 10 and the FET 20 are provided in different double wells. Specifically, the FET 10 and the FET 20 are provided in the double well 40 and a double well 70, respectively. The double well 70 is formed by an n-type well region 72 (deep n-well) and the p-type well region 74. Contact plugs 66 are electrically connected to the well region 72 through an n+ diffusion layer 76. The contact plugs 66 and the contact plugs 68 are electrically connected to each other by wiring 67. Except for this, the structure of the semiconductor memory device 3 is the same as that of the semiconductor memory device 1.

It is to be noted that the potentials of a node N72 and a node N74 of FIG. 11 correspond to the potentials of the well region 72 and the well region 74 shown in FIGS. 9 and 10, respectively.

Figure 12A:
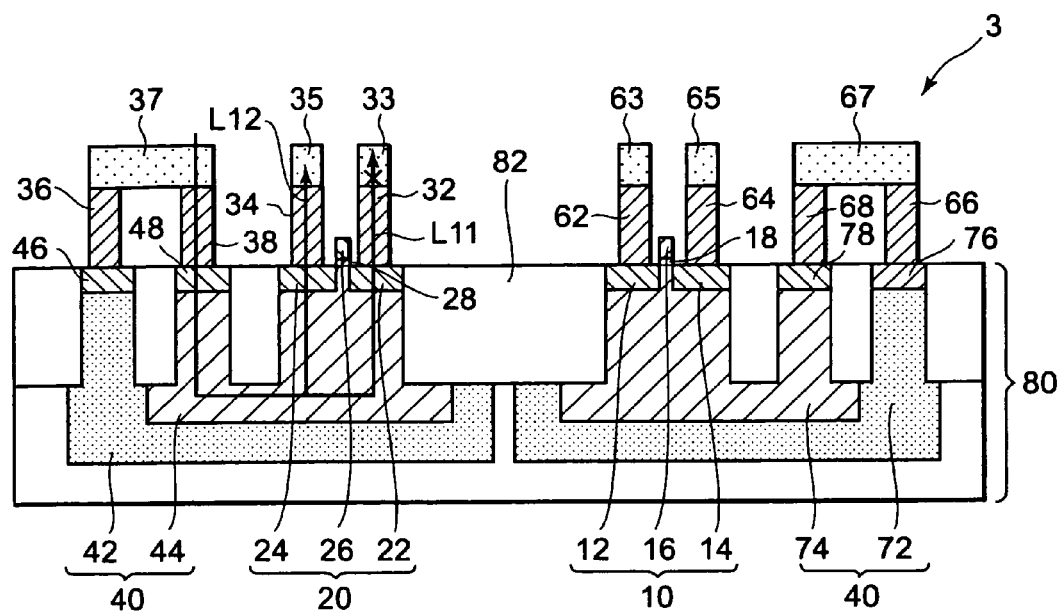
FIGS. 12A and 12B are sectional views for explaining operation of the semiconductor memory device according to the third embodiment.
Figure 12B:
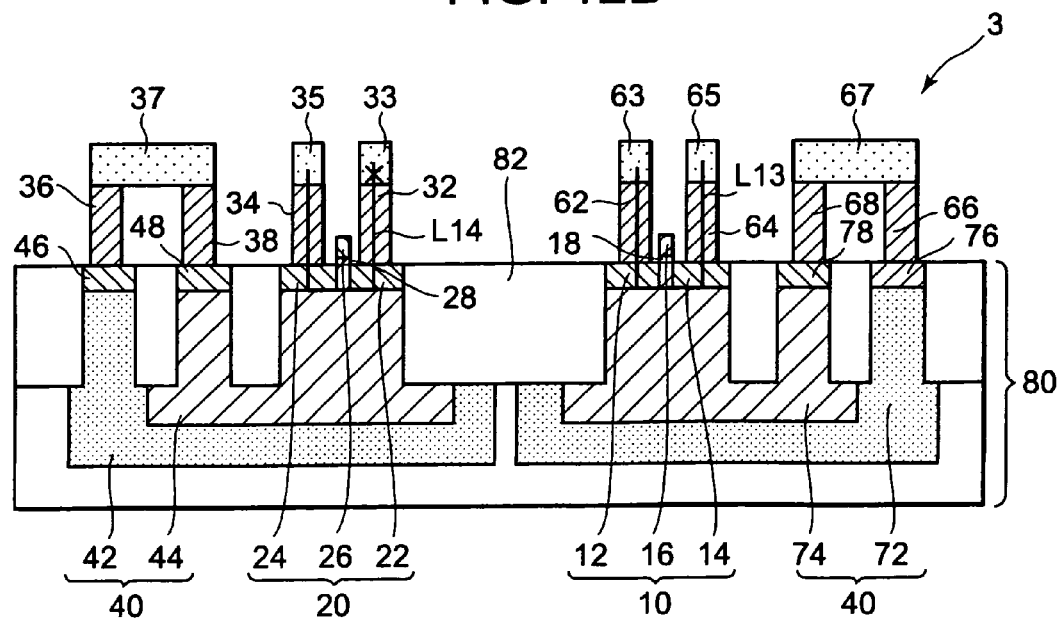

Exemplary operation of the semiconductor memory device 3 is now described with reference to FIGS. 12A and 12B as a third embodiment of a method of writing data and a method of reading data according to the present invention. Those figures illustrate a section identical to that illustrated in FIG. 10. When data is written, as illustrated by a line L11 of FIG. 12A, current is passed through the contact plug 32 so that the resistance of the contact plug 32 is increased. When data is read, the detection circuit 50 detects the difference between the output of the FET 10 and the output of the FET 20 with predetermined potential being applied to the power supply line 52. For example, as illustrated by lines L13 and L14 of FIG. 12B, current is passed between the sources and the drains of the FETs 10 and 20, respectively, and the difference between the output potential of the FET 10 and the output potential of the FET 20 is detected.

In this embodiment, the FET 10 and the FET 20 are provided in the different double wells 40 and 70. This can prevent current from flowing into the FET 10 when the current is passed through the contact plug 32. Further, the double wells 40 and 70 have the identical well structure. Specifically, both the double wells 40 and 70 are formed by the deep n-well (the well region 42 or 72) and the p-well (the well region 44 or 74) formed therein. This makes easier the design of the FETs 10 and 20.

Further, the number of the contact plug 32 which is the conductive plug whose resistance is intended to be increased is smaller than the number of the contact plugs 34. This makes it possible to increase the resistance of the contact plug 32 with more reliability compared with the case where the numbers of the contact plug 32 and the contact plugs 34 are the same. This is described in detail in the following. As illustrated by a line L12 of FIG. 12A, when current is passed through the contact plug 32, the current may also pass through the contact plugs 34. Even in such a case, if the number of the contact plug 32 is smaller than the number of the contact plugs 34, the amount of current per contact plug is larger in the case of the contact plug 32 than in the case of the contact plugs 34. Therefore, the resistance of the contact plug 32 can be selectively increased. Except for this, effects of this embodiment is the same as those of the first embodiment of the present invention.

Fourth Embodiment

Figure 13:
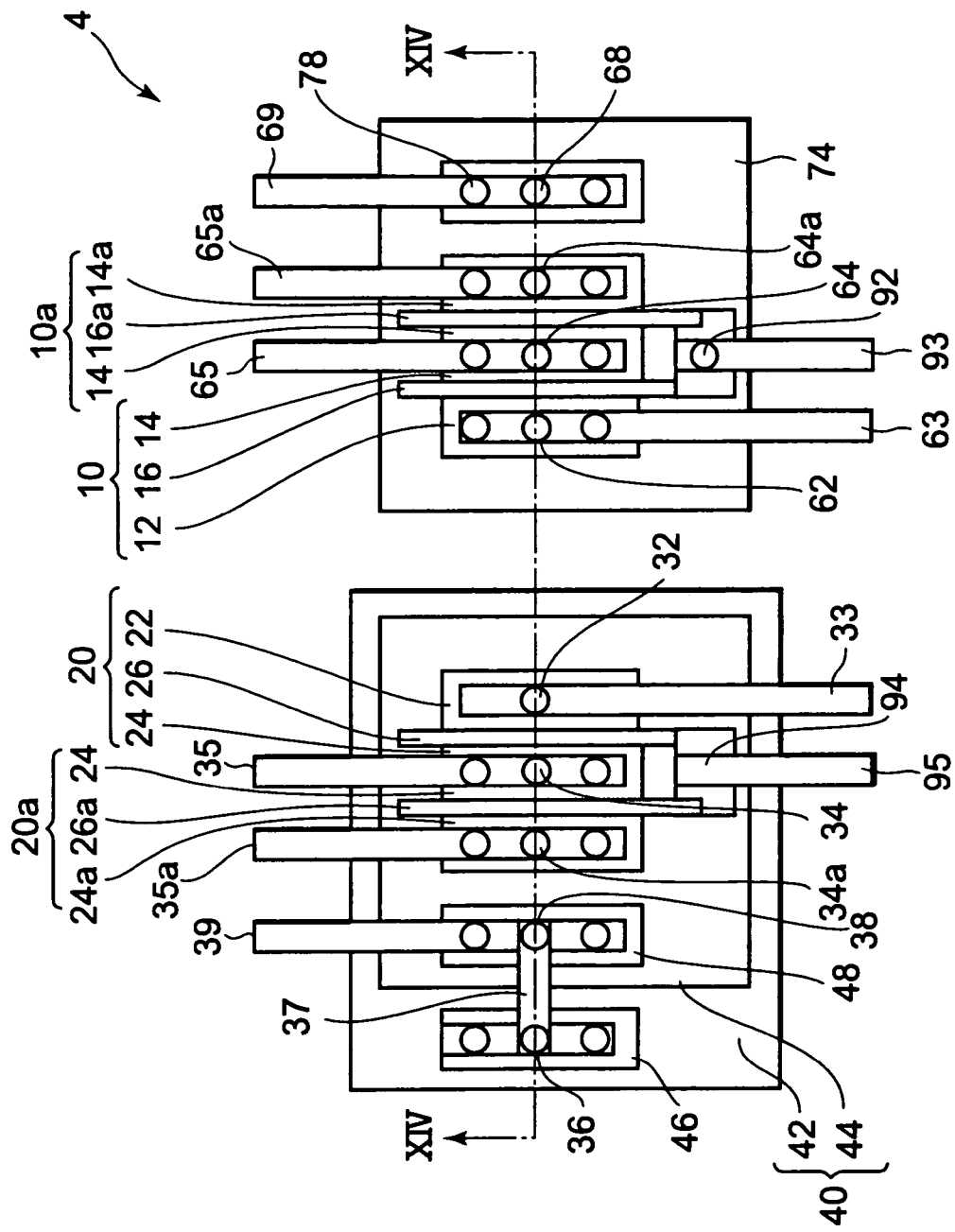
FIG. 13 is a plan view illustrating a fourth embodiment of a semiconductor memory device according to the present invention.
Figure 14:
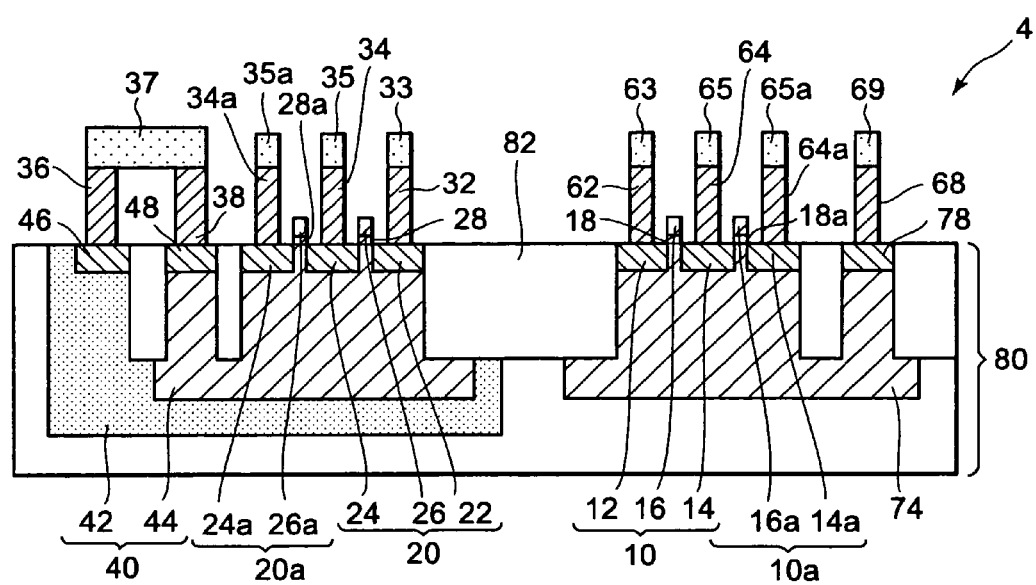
FIG. 14 is a sectional view illustrating the fourth embodiment of a semiconductor memory device according to the present invention.
Figure 15:
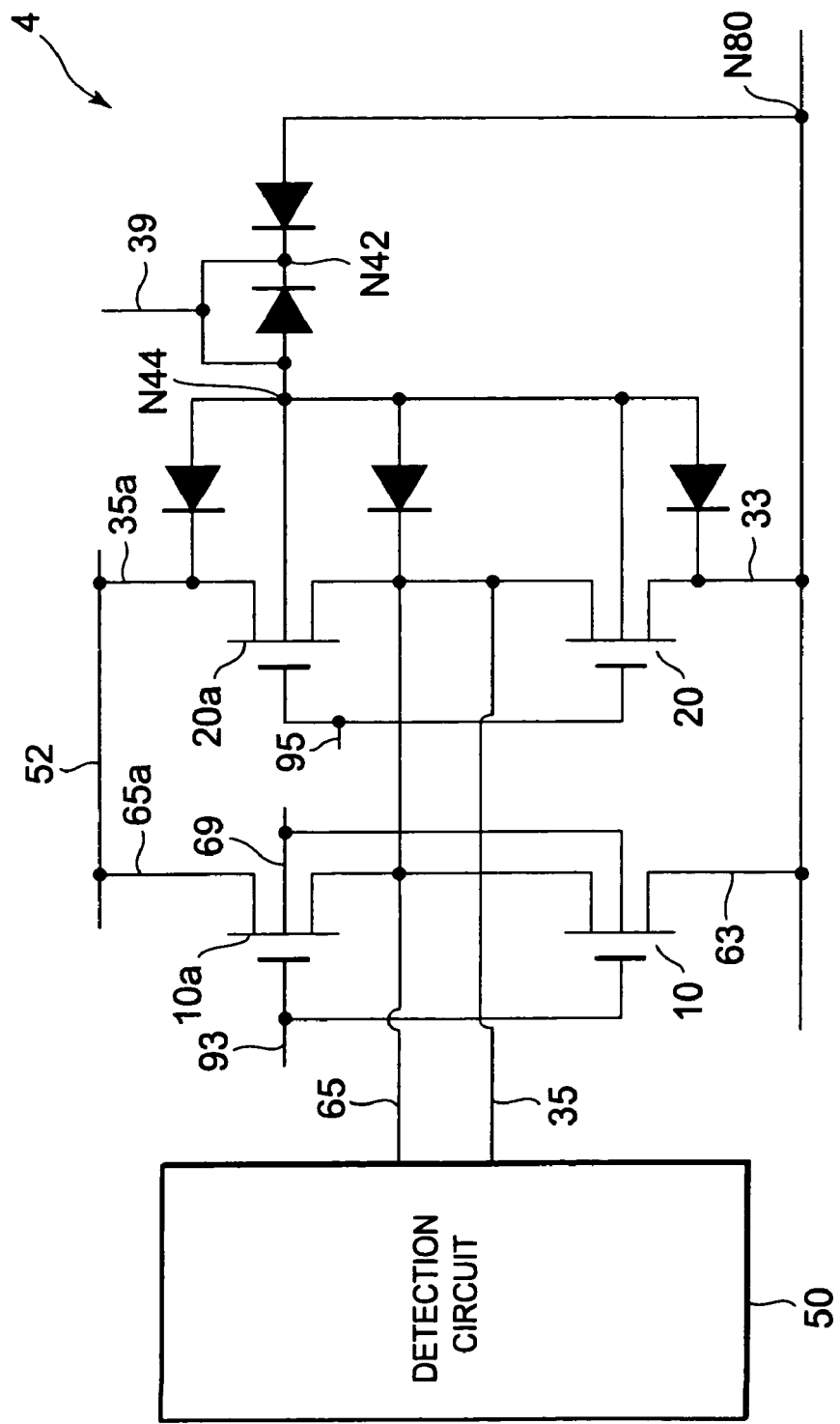
FIG. 15 is a circuit diagram of the semiconductor memory device according to the fourth embodiment.

FIGS. 13 and 14 are a plan view and a section, respectively, illustrating a fourth embodiment of a semiconductor memory device according to the present invention. FIG. 14 is a section taken along the line XIV-XIV of FIG. 13. FIG. 15 is a circuit diagram of the semiconductor memory device. In a semiconductor memory device 4, the FET 10 and a FET 10a are transistors in a pair. The FET 10a has n+ diffusion layers 14 and 14a and a gate electrode 16a. The gate electrode 16a is provided on the semiconductor substrate 80 with a gate insulating film 18a therebetween. The diffusion layer 14 is shared by the FET 10 and the FET 10a. Similarly, the FET 20 and a FET 20a are transistors in a pair. The FET 20a has n+ diffusion layers 24 and 24a, and a gate electrode 26a. The gate electrode 26a is provided on the semiconductor substrate 80 with a gate insulating film 28a therebetween. The diffusion layer 24 is shared by the FET 20 and the FET 20a. Contact plugs 64a and contact plugs 34a are connected to the diffusion layer 14a and the diffusion layer 24a, respectively. Wiring 65a and wiring 35a are connected to the contact plugs 64a and the contact plugs 34a, respectively.

As illustrated in FIG. 15, the detection circuit 50 is connected between the FET 10 and the FET 10a and between the FET 20 and the FET 20a. Specifically, the detection circuit 50 is connected to a drain of the FET 10 (source of the FET 10a) and to a drain of the FET 20 (source of the FET 20a). Except for this, the structure of the semiconductor memory device 4 is the same as that of the semiconductor memory device 1.

Figure 16A:
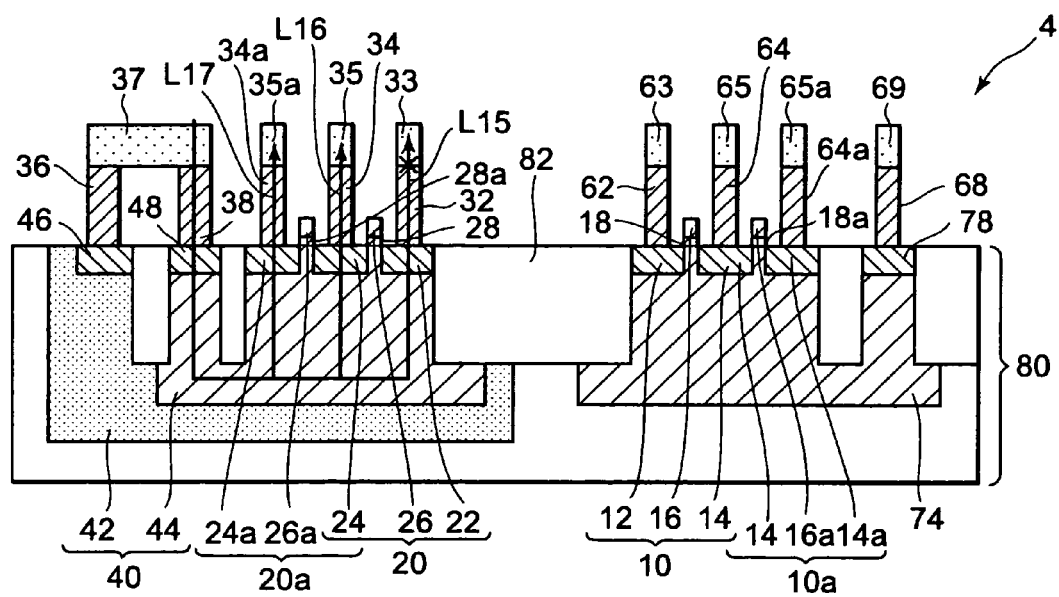
FIGS. 16A and 16B are sectional views for explaining operation of the semiconductor memory device according to the fourth embodiment.
Figure 16B:
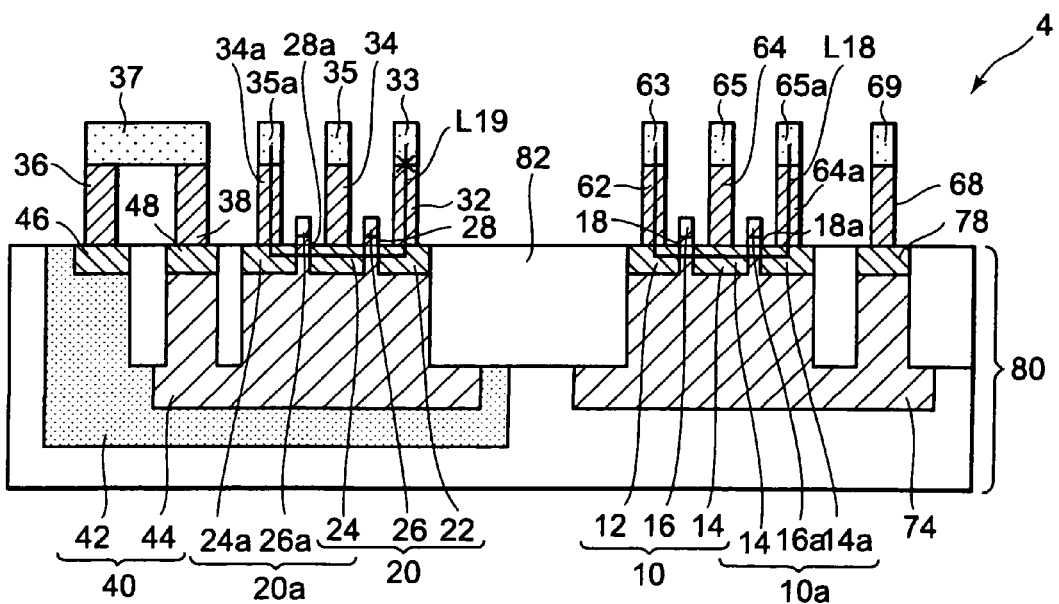

Exemplary operation of the semiconductor memory device 4 is now described with reference to FIGS. 16A and 16B as a fourth embodiment of a method of writing data and a method of reading data according to the present invention. Those figures illustrate a section identical to that illustrated in FIG. 14. When data is written, as illustrated by a line L15 of FIG. 16A, current is passed through the contact plug 32 so that the resistance of the contact plug 32 is increased. When data is read, the detection circuit 50 detects the difference between the output of the FET 10 and the output of the FET 20 with predetermined potential being applied to the power supply line 52. For example, as illustrated by lines L18 and L19 of FIG. 16B, current is passed between the sources and the drains of the transistors in a pair, respectively (between the source of the FET 10 and the drain of the FET 10a and between the source of the FET 20 and the drain of the FET 20a), and accordingly the difference between the output potential of the FET 10 and the output potential of the FET 20 is detected.

In this embodiment, the detection circuit 50 is connected between the FET 10 and FET 10a which are transistors in one pair and between the FET 20 and FET 20a which are transistors in another pair. Therefore, by detecting the difference between the intermediate potentials of the transistors in pairs, data can be read. With such a structure, data can be read without passing current through the detection circuit 50.

Further, the number of the contact plug 32 which is the conductive plug whose resistance is intended to be increased is smaller than the numbers of the contact plugs 34 and 34a. This makes it possible to increase the resistance of the contact plug 32 with more reliability compared with the case where the numbers of the contact plug 32 and the contact plugs 34 and 34a are the same. This is described in detail in the following. As illustrated by lines L16 and L17 of FIG. 16A, when current is passed through the contact plug 32, the current may also pass through the contact plugs 34 and 34a. Even in such a case, if the number of the contact plug 32 is smaller than the numbers of the contact plugs 34 and 34a, the amount of current per contact plug is larger in the case of the contact plug 32 than in the case of the contact plugs 34 and 34a. Therefore, the resistance of the contact plug 32 can be selectively increased. Except for this, effects of this embodiment is the same as those of the first embodiment of the present invention.

Fifth Embodiment

Figure 17:
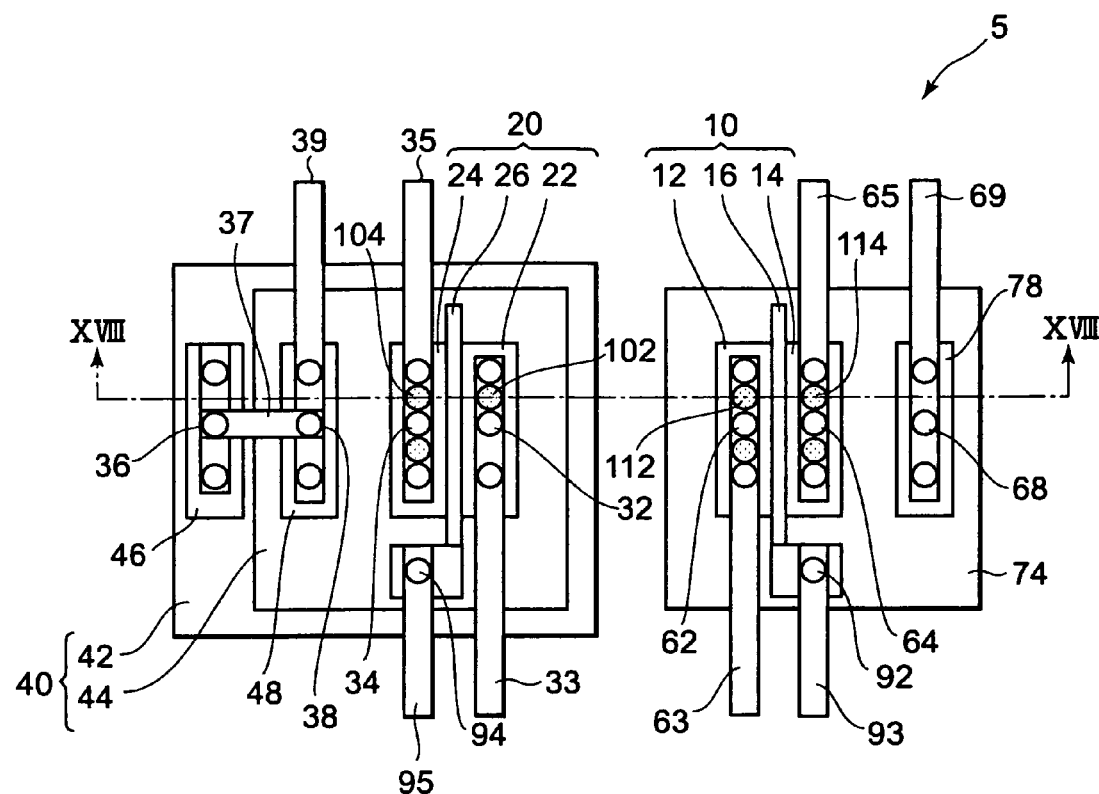
FIG. 17 is a plan view illustrating a fifth embodiment of a semiconductor memory device according to the present invention.
Figure 18:
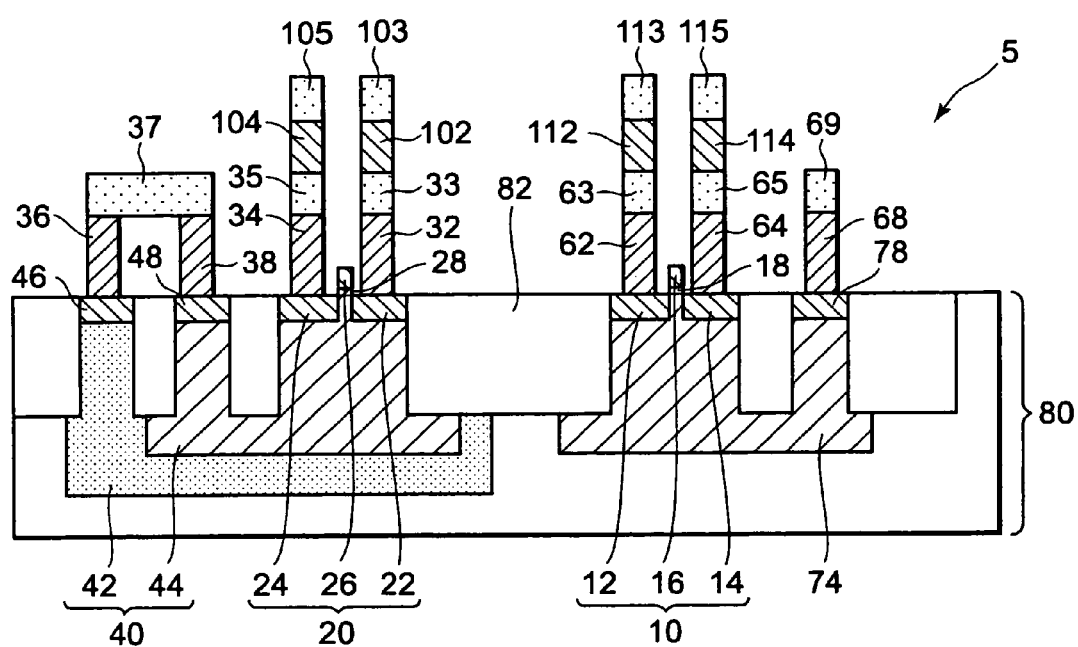
FIG. 18 is a sectional view illustrating the fifth embodiment of a semiconductor memory device according to the present invention.

FIGS. 17 and 18 are a plan view and a sectional view, respectively, illustrating a fifth embodiment of a semiconductor memory device according to the present invention. FIG. 18 is a section taken along the line XVIII-XVIII of FIG. 17. In a semiconductor memory device 5, a via plug 102 (first conductive plug), via plugs 104 (second conductive plugs), via plugs 112, and via plugs 114 are provided. While a contact plug is a conductive plug which connects a diffusion layer (or a gate electrode) and wiring, a via plug is a conductive plug which connects one wiring and another wiring.

The via plug 102 is electrically connected to the diffusion layer 22 of the FET 20 through the contact plug 32 and the wiring 33. The via plugs 104 are electrically connected to the diffusion layer 24 of the FET 20 through the contact plugs 34 and the wiring 35. The via plugs 112 are electrically connected to the diffusion layer 12 of the FET 10 through the contact plugs 62 and the wiring 63. The via plugs 114 are electrically connected to the diffusion layer 14 of the FET 10 through the contact plugs 64 and the wiring 65. Wiring 103, 105, 113, and 115 are connected to the via plugs 102, 104, 112, and 114, respectively. Here, the number of the via plug 102 is smaller than the numbers of the via plugs 104, 112, and 114. Except for this, the structure of the semiconductor memory device 5 is the same as that of the semiconductor memory device 1.

Figure 19A:
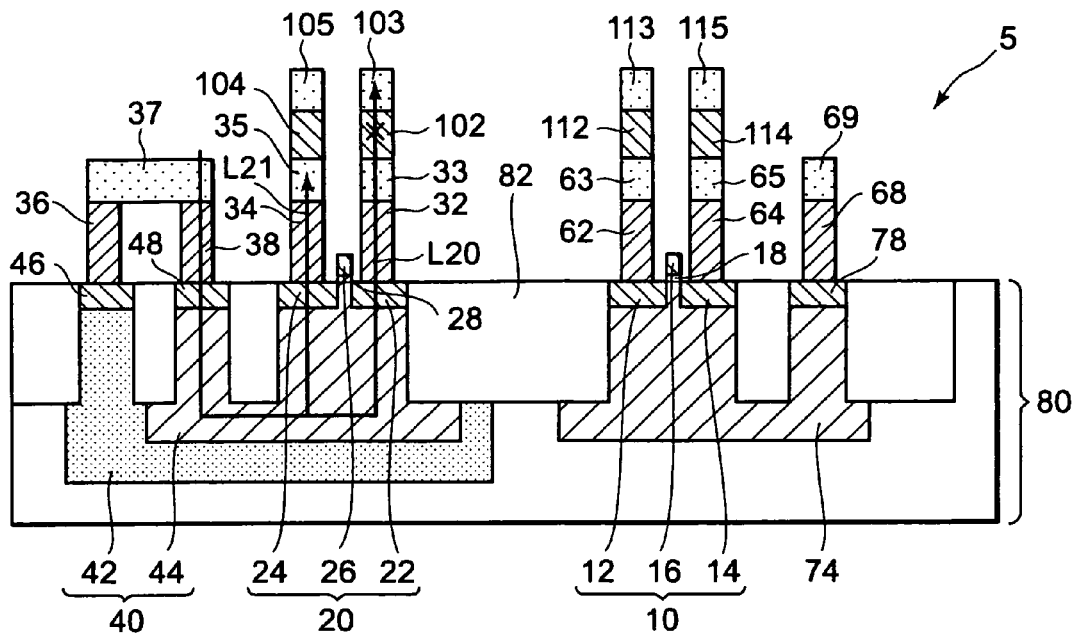
FIGS. 19A and 19B are sectional views for explaining operation of the semiconductor memory device according to the fifth embodiment.
Figure 19B:
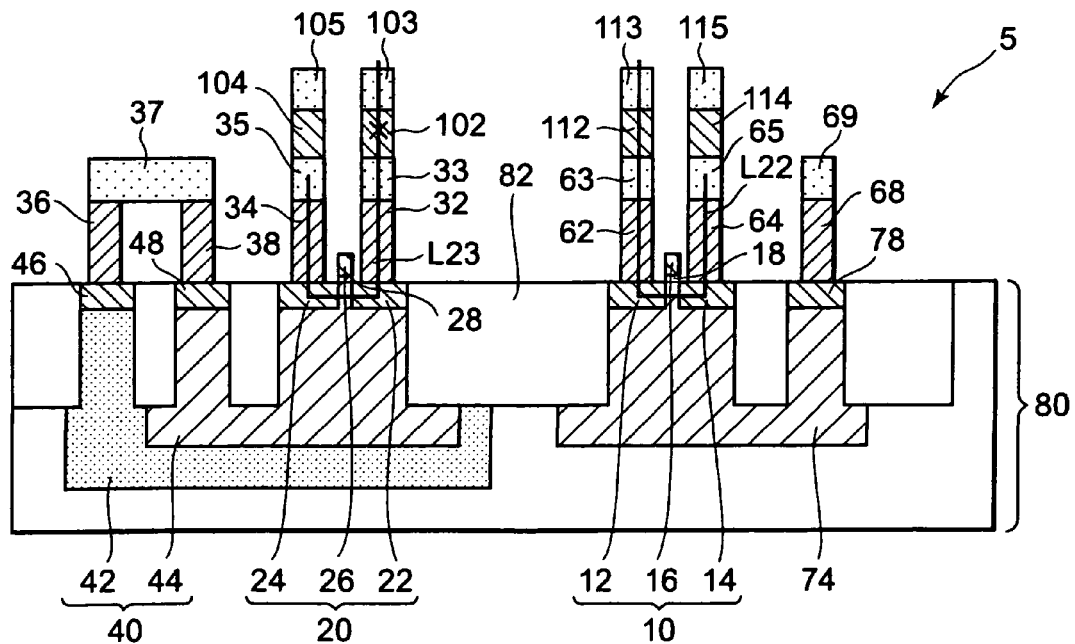

Exemplary operation of the semiconductor memory device 5 is now described with reference to FIGS. 19A and 19B as a fifth embodiment of a method of writing data and a method of reading data according to the present invention. Those figures illustrate a section identical to that illustrated in FIG. 18. When data is written, as illustrated by a line L20 of FIG. 19A, current is passed through the via plug 102 so that the resistance of the via plug 102 is increased. When data is read, the detection circuit 50 detects the difference between the output of the FET 10 and the output of the FET 20 with predetermined common potential being applied to the wirings 35 and 65. For example, as illustrated by lines L22 and L23 of FIG. 19B, current is passed between the sources and the drains of the FETs 10 and 20, and accordingly the difference between the output potential of the FET 10 and the output potential of the FET 20 is detected. It is to be noted that the wiring 103 and the wiring 113 are connected to the detection circuit 50.

In this embodiment, the number of the via plug 102 which is the conductive plug whose resistance is intended to be increased is smaller than the number of the via plugs 104. This makes it possible to increase the resistance of the via plug 102 with more reliability compared with the case where the numbers of the two kinds of via plugs are the same. This is described in detail in the following. As illustrated by a line L21 of FIG. 19A, when current is passed through the via plug 102, the current may also pass through the via plugs 104. Even in such a case, if the number of the via plug 102 is smaller than the number of the via plugs 104, the amount of current per via plug is larger in the case of the via plug 102 than in the case of the via plugs 104. Therefore, the resistance of the via plug 102 can be selectively increased. Except for this, effects of this embodiment is the same as those of the first embodiment of the present invention.

The present invention is not limited to the above-mentioned embodiments and various modifications are possible. For example, the above-mentioned embodiments illustrate the cases where the semiconductor substrate 80, the well regions 44 and 74, and the diffusion layers 48 and 78 are of p-type while the well regions 42 and 72 and the diffusion layers 12, 14, 22, 24, 46, and 76 are of n-type. However, the semiconductor substrate 80, the well regions 44 and 74, and the diffusion layers 48 and 78 may be of n-type while the well regions 42 and 72 and the diffusion layers 12, 14, 22, 24, 46, and 76 may be of p-type.

Further, in the above-mentioned embodiments, the cases where the number of the conductive plugs connected to the source region of the FET 20 is smaller than the number of the conductive plugs connected to the drain region are described. However, the number of the conductive plugs connected to the drain region of the FET 20 may be smaller than the number of the conductive plugs connected to the source region. Further, in the above-mentioned embodiments, the detection circuit 50 may be connected to the source side or to the drain side of the FETs 10 and 20.

Although the present invention has been described above in connection with several preferred embodiments thereof, it is apparent that the present invention is not limited to above embodiments, but may be modified and changed without departing from the scope and spirit of the invention.

What is claimed is:

1. A semiconductor memory device, comprising:
a first field-effect transistor provided in a double well;
m (m is a natural number) first conductive plugs electrically connected to one of a source region and a drain region of the first field-effect transistor; and
n (n is a natural number) second conductive plugs electrically connected to other of the source region and the drain region of the first field-effect transistor,
wherein m is smaller than n.

2. A semiconductor memory device according to claim 1, further comprising:
a second field-effect transistor;
a detection circuit for detecting a difference between an output of the first field-effect transistor and an output of the second field-effect transistor.

3. A semiconductor memory device according to claim 2, wherein only the first field-effect transistor out of the first field-effect transistor and the second field-effect transistor is provided in the double well.

4. A semiconductor memory device according to claim 2, wherein both of the first field-effect transistor and the second field-effect transistor are provided in the same double well.

5. A semiconductor memory device according to claim 2, wherein both of the first field-effect transistor and the second field-effect transistor are provided in double wells different from each other.

6. A semiconductor memory device according to claim 2, wherein a gate width and a gate length of the first field-effect transistor are equal to a gate width and a gate length of the second field-effect transistor, respectively.

7. A semiconductor memory device according to claim 2, wherein the gate lengths of the first field-effect transistor and the second field-effect transistor are larger than a minimum gate length of field-effect transistors provided in the semiconductor memory device.

8. A method of reading data from the semiconductor memory device according to claim 2, comprising:
detecting the difference between the output of the first field-effect transistor and the output of the second field-effect transistor.

9. A method of reading data according to claim 8, wherein the detecting the difference includes detecting a difference between an output potential of the first field-effect transistor and an output potential of the second field-effect transistor.

10. A semiconductor memory device according to claim 1, wherein the first conductive plugs and the second conductive plugs are electrically connected to the source region and the drain region, respectively, of the first field-effect transistor.

11. A semiconductor memory device according to claim 1, wherein the first conductive plugs and the second conductive plugs are provided in the same layer.

12. A semiconductor memory device according to claim 1, wherein each of the first conductive plugs and the second conductive plugs comprises a contact plug.

13. A semiconductor memory device according to claim 1, wherein each of the first conductive plugs and the second conductive plugs comprises a via plug.

14. A method of writing data in the semiconductor memory device according to claim 1, comprising:
passing current so that resistance of at least one of the first conductive plugs is increased, through the at least one of the first conductive plugs.

15. A method of writing data according to claim 14, wherein the passing current includes passing current through the at least one of the first conductive plugs by applying forward bias voltage between one of the source region and the drain region of the second field-effect transistor and the well region.

* * * * *